US 8,288,921 B2

(12) United States Patent
Terazono et al.

(10) Patent No.: US 8,288,921 B2
(45) Date of Patent: Oct. 16, 2012

(54) MULTILAYER PIEZOELECTRIC ELEMENT AND INJECTOR USING THE SAME

(75) Inventors: Masaki Terazono, Kirishima (JP);
Takafumi Tsurumaru, Kirishima (JP);
Shigenobu Nakamura, Kirishima (JP);
Ken Yamamoto, Kirishima (JP)

(73) Assignee: Kyocera Corporation, Kyoto (JP)

( * ) Notice: Subject to any disclaimer, the term of this patent is extended or adjusted under 35 U.S.C. 154(b) by 749 days.

(21) Appl. No.: 12/088,428

(22) PCT Filed: Sep. 29, 2006

(86) PCT No.: PCT/JP2006/319482
§ 371 (c)(1),
(2), (4) Date: Jul. 28, 2009

(87) PCT Pub. No.: WO2007/037377
PCT Pub. Date: Apr. 5, 2007

(65) Prior Publication Data
US 2010/0032503 A1 Feb. 11, 2010

(30) Foreign Application Priority Data

Sep. 29, 2005 (JP) ................................. 2005-283684
Oct. 28, 2005 (JP) ................................. 2005-313865
Mar. 29, 2006 (JP) ................................. 2006-089697

(51) Int. Cl.
*H01L 41/047* (2006.01)
*H01L 41/083* (2006.01)
(52) U.S. Cl. ....................................... 310/328; 310/366
(58) Field of Classification Search ................ 310/328, 310/366
See application file for complete search history.

(56) References Cited

U.S. PATENT DOCUMENTS

| 7,355,327 | B2 * | 4/2008 | Kimura et al. ............... 310/366 |
| 7,454,820 | B2 * | 11/2008 | Nakamura .................... 29/25.35 |
| 7,594,309 | B2 * | 9/2009 | Iwase et al. .................. 29/25.35 |
| 7,598,660 | B2 * | 10/2009 | Kobayashi et al. ........... 310/366 |
| 7,705,525 | B2 * | 4/2010 | Kondo et al. ................. 310/366 |
| 7,902,726 | B2 * | 3/2011 | Okamura et al. ............. 310/328 |
| 2006/0238073 | A1 * | 10/2006 | Ragossnig et al. ............ 310/328 |
| 2007/0080612 | A1 * | 4/2007 | Terazono et al. ............. 310/366 |

(Continued)

FOREIGN PATENT DOCUMENTS

DE 102004050803 A1 * 4/2006

(Continued)

OTHER PUBLICATIONS

Chinese language office action and its English language translation for corresponding Chinese application 200680035819.5.

*Primary Examiner* — Jaydi San Martin
(74) *Attorney, Agent, or Firm* — DLA Piper LLP (US)

(57) ABSTRACT

In a multilayer piezoelectric element comprising a plurality of piezoelectric layers and a plurality of metal layers which are alternately stacked one upon another, the metal layers includes a plurality of high resistance metal layers having a higher electrical resistance than adjacent metal layers on the both sides. The high resistance metal layers are regularly arranged so as to interpose a plurality of different metal layers other than the high resistance metal layers. In another multilayer piezoelectric element in which a plurality of piezoelectric layers and a plurality of metal layers are alternately stacked one upon another, at least one layer of the metal layers is formed by a plurality of partial metal layers disposed between the piezoelectric layers.

18 Claims, 6 Drawing Sheets

U.S. PATENT DOCUMENTS

2010/0060110 A1 * 3/2010 Inagaki et al. .............. 310/366

FOREIGN PATENT DOCUMENTS

| | | | |
|---|---|---|---|
| JP | 60-086880 | | 5/1985 |
| JP | 61-133715 | | 6/1986 |
| JP | 63288075 A | * | 11/1988 |
| JP | 01-130568 | | 9/1989 |
| JP | 03-064979 | | 3/1991 |
| JP | 03064979 A | * | 3/1991 |
| JP | 03-106082 | | 5/1991 |
| JP | 06-326370 | | 11/1994 |
| JP | 10-199750 | | 7/1998 |
| JP | 11-186626 | | 7/1999 |
| JP | 2001-144340 | | 5/2001 |

* cited by examiner

Fig. 1
(a)
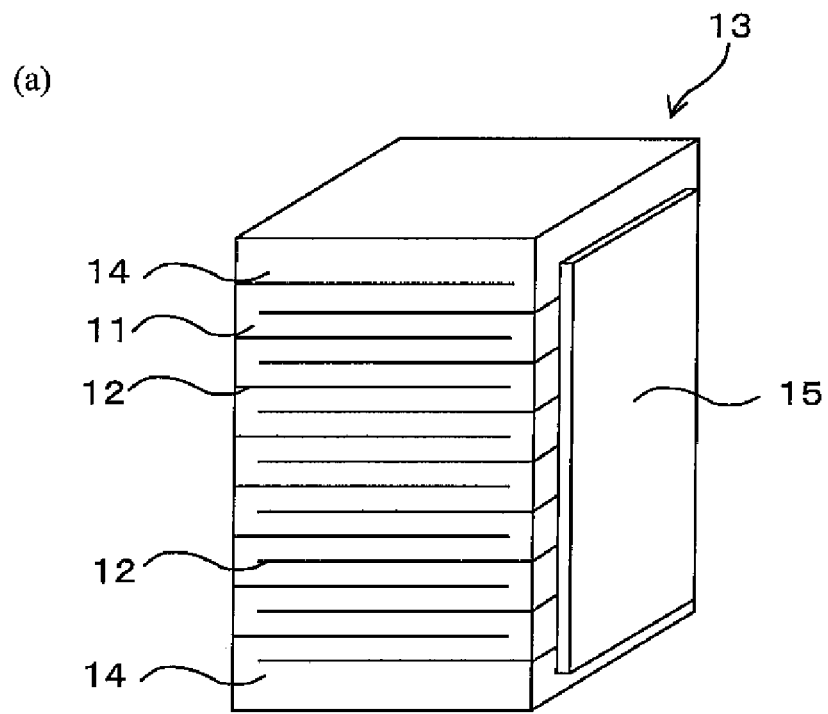
(b)
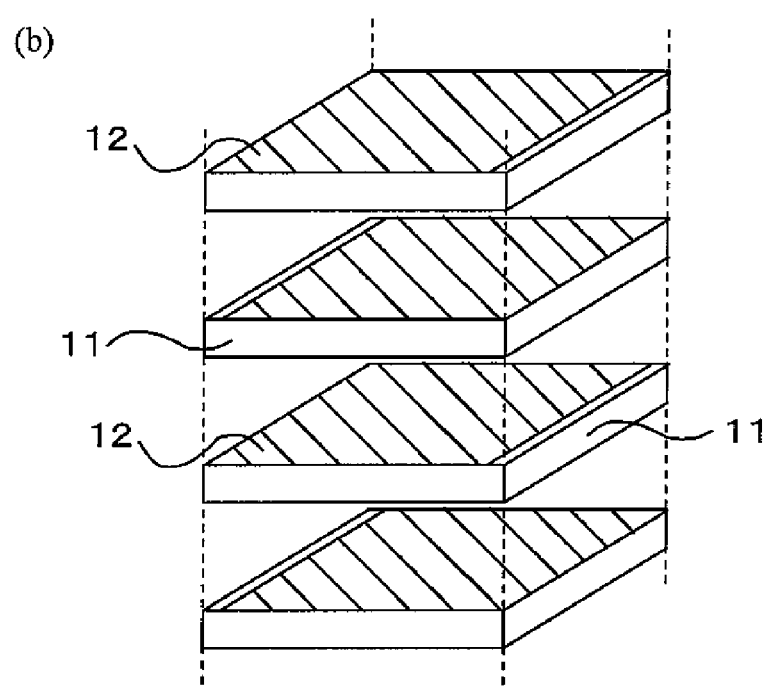

Fig. 3
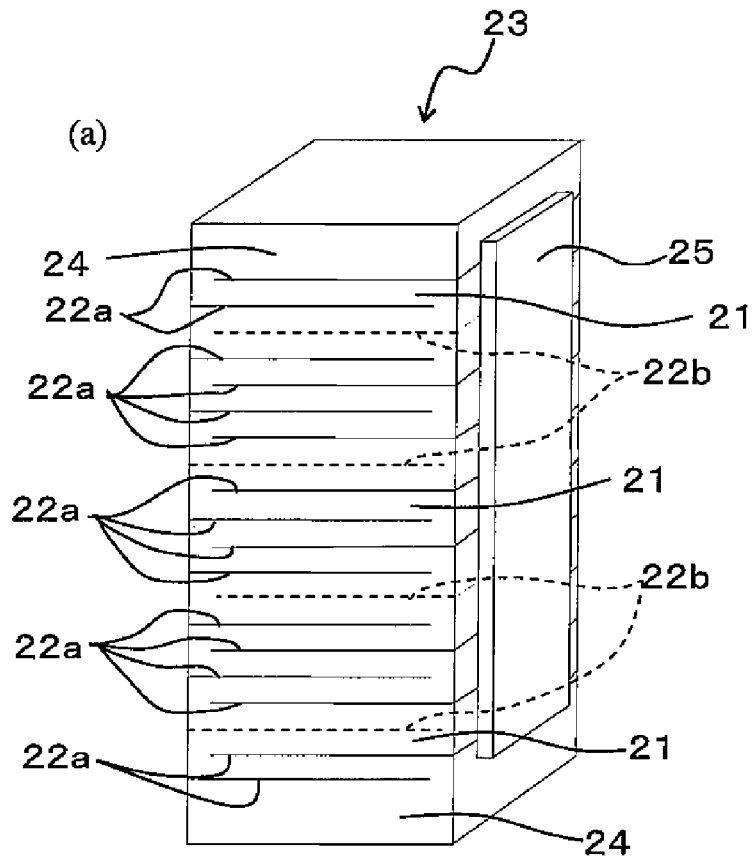
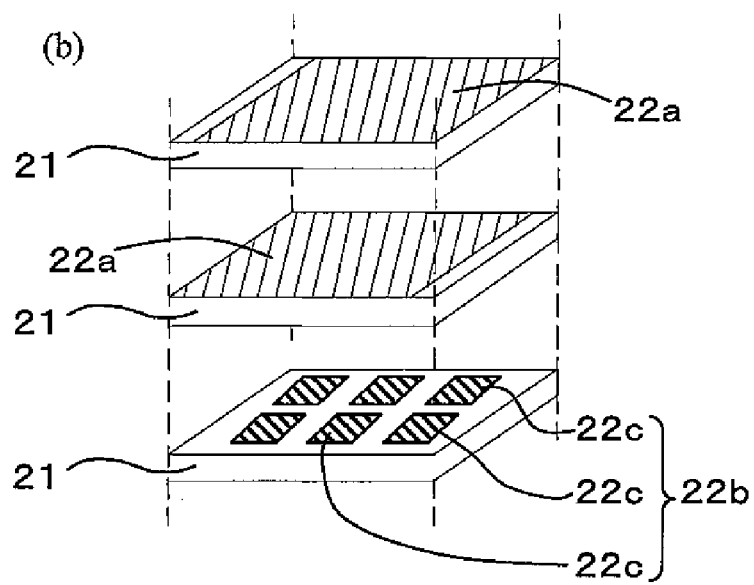

Fig. 6
(a)
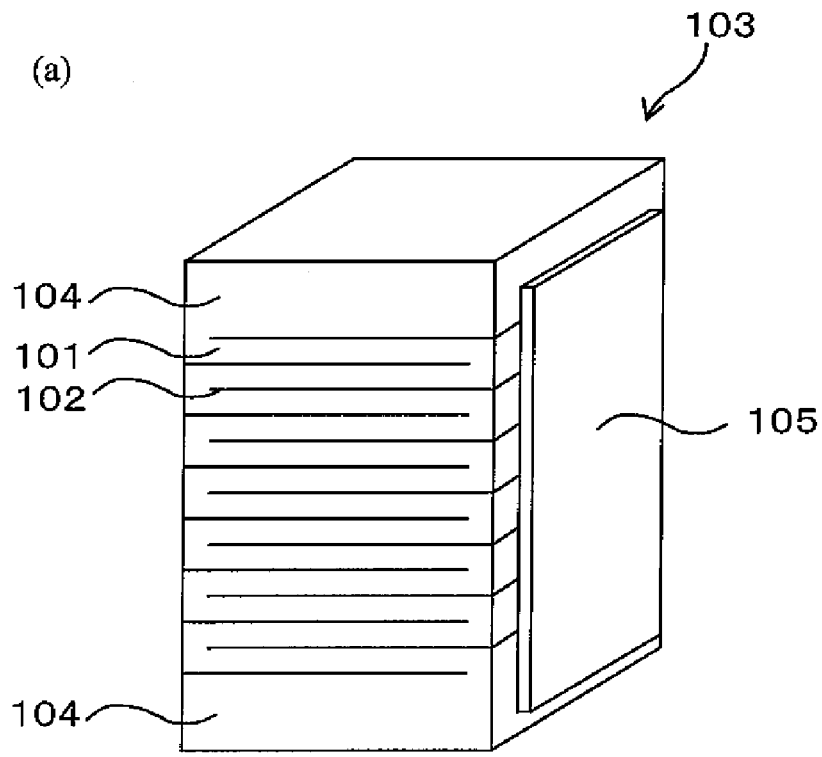
(b)
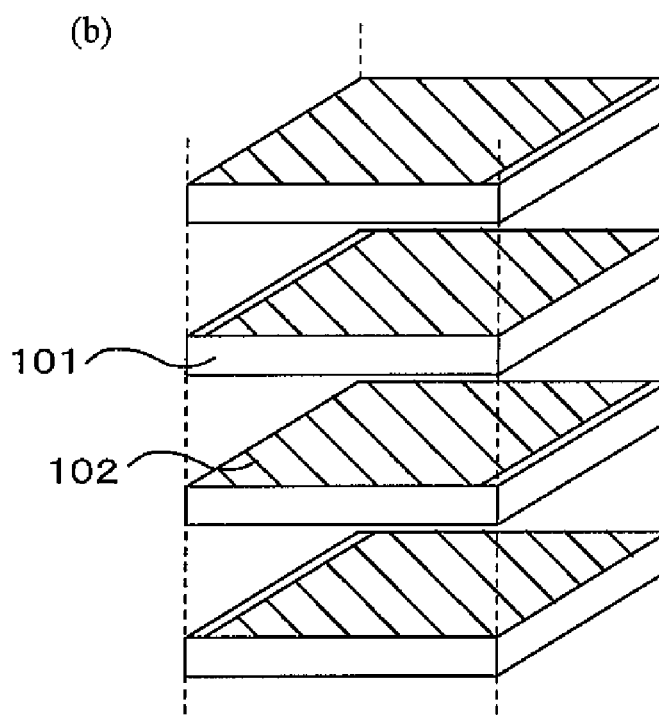

US 8,288,921 B2

MULTILAYER PIEZOELECTRIC ELEMENT AND INJECTOR USING THE SAME

CROSS REFERENCE TO RELATED APPLICATION

This application is a national stage of International Application No. PCT/JP20061/319482 filed on Sep. 29, 2006, and claims the benefit of priority under 35 USC 119 of Japanese Patent Application No. 2005-283684 filed on Sep. 29, 2005; Japanese Patent Application No. 2005-313865 filed on Oct. 28, 2005 and Japanese Patent Application No. 2006-089697 filed on Mar. 29, 2006 which are incorporated herein by reference.

TECHNICAL FIELD

The present invention relates to a multilayer piezoelectric element (in some cases hereinafter referred to simply as an "element") and an injector, and in particular, to a multilayer piezoelectric element and an injector which are suitable for a long-term continuous driving under high voltage and high pressure.

BACKGROUND ART

As an example employing a multilayer piezoelectric element, piezoelectric actuators in which piezoelectric layers and metal layers are alternately stacked one upon another have conventionally been proposed. In general, the piezoelectric actuators can be classified into the following two types, namely simultaneous sintering type, and stacked type in which piezoelectric porcelains consisting of a piezoelectric body and metal layers of plate-like body are alternately stacked one upon another. Among others, the simultaneous sintering type piezoelectric actuators are often used from the viewpoints of lower voltage and manufacturing cost reductions. The simultaneous sintering type piezoelectric actuators facilitate a reduction in layer thickness and have excellent miniaturization and durability.

FIG. 6(a) is a perspective view showing a conventional multilayer piezoelectric element. FIG. 6(b) is a partial perspective view showing the stacked state of piezoelectric layers and metal layers in FIG. 6(a). As shown in FIGS. 6(a) and 6(b), the multilayer piezoelectric element has a stacked body 103, and a pair of external electrodes 105 formed on opposed side surfaces, respectively. The stacked body 103 is configured by alternately stacking piezoelectric layers 101 and metal layers 102. Inactive layers 104 are stacked on both end surfaces of the stacked body 103 in the stacking direction, respectively. The metal layers (internal electrode layers) 102 are not formed entirely over the main surfaces of the piezoelectric layers 101, thereby forming a so-called partial electrode structure. The metal layers 102 in the partial electrode structure are stacked so as to be exposed by every other layer to different side surfaces of the stacked body 103, and the metal layers 102 are connected by every other layer to the pair of external electrodes 105, respectively.

A method of manufacturing the conventional multilayer piezoelectric element is as follows. That is, firstly, a metal paste is printed on a ceramic green sheet containing the raw material of the piezoelectric layers 101, in such a pattern as shown in FIG. 6(b), which forms a predetermined metal layer structure. Then, a plurality of the green sheets with the metal paste printed thereon are stacked one upon another to prepare a stacked forming body. The stacked forming body is then sintered to obtain the stacked body 103. Thereafter, the metal paste is applied to the opposed side surfaces of the stacked body 103, and then sintered to form a pair of the external electrodes 105, resulting in the multilayer piezoelectric element as shown in FIG. 6(a) (for example, refer to Patent Document 1).

As the metal layers 102, in general, an alloy of silver and palladium is often used. In order to simultaneously sinter the piezoelectric layers 101 and the metal layers 102, the metal composition of the metal layers 102 is often set to a 70% by mass of silver and a 30% by mass of palladium (for example, refer to Patent Document 2). The following is the reason that the metal layers 102 composed of the alloy of silver and palladium are used instead of the metal layers consisting only of silver.

That is, the composition of the metal layers 102, which consists only of silver and contains no palladium, causes so-called ion migration phenomenon that when a potential difference is applied to between the opposed metal layers 102, the silver ions in the metal layers 102 migrate through the element surface, from the positive electrode to the negative electrode in the opposed metal layers 102. This phenomenon tends to occur remarkably in the atmosphere of high temperature and high moisture.

On the other hand, for the purpose of forming the metal layers 102 of substantially identical metal filling rate, a metal paste whose metal composition ratio and metal concentration are prepared so as to be substantially the same has conventionally been used. When this metal paste is screen-printed on the ceramic green sheet, the stacked body 103 is prepared by setting a mesh density and a resist thickness to substantially the same condition.

When ceramic green sheets are pressed and stacked, the area where the metal layers 102 are overlapped with each other, and the area where the metal layers 102 are not overlapped with each other have different pressed states, so that the metal layer density might become non-uniform even in the same surface of the metal layer 102. Hence, there has been proposed the method in which the metal filling rate is equalized by forming recess portions in a ceramic tape corresponding to the area where the metal layer 102 should be formed (for example, refer to Patent Document No. 3).

When the abovementioned conventional multilayer piezoelectric element is used as a piezoelectric actuator, it can be driven by connecting and securing lead wires (not shown) by soldering to the external electrodes 105, respectively, and then applying a predetermined potential to between the external electrodes 105. Recently, the multilayer piezoelectric elements are further miniaturized and also required to ensure a large displacement under large pressure. Hence, the abovementioned multilayer piezoelectric element is required to be usable even under severe conditions of higher electric field application and a long-term continuous driving.

In order to meet the abovementioned requirements of the long-term continuous driving under high electric field and high pressure, Patent Document 4 has proposed the element provided with a layer in which the piezoelectric layer 101 has a different thickness. That is, the attempt to relax stress has been made by utilizing the fact that a different thickness causes a different displacement from other layer.

In the stacked type of multilayer piezoelectric element, it has been proposed to control so that the contact resistance of the interface between the metal layer and the piezoelectric layer is high at the center in the stacking direction of the multilayer piezoelectric element, and is lowered toward the both ends, and so that no stress concentrates at the center in the stacking direction of the multilayer piezoelectric element (for example, refer to Patent Document 5).

Patent Document 1: Japanese Unexamined Patent Publication No. 61-133715
Patent Document 2: Japanese Unexamined utility model Publication No. 01-130568
Patent Document 3: Japanese Unexamined Patent Publication No. 10-199750
Patent Document 4: Japanese Unexamined Patent Publication No. 60-86880
Patent Document 5: Japanese Unexamined Patent Publication No. 06-326370

DISCLOSURE OF THE INVENTION

Problems to be Solved by the Invention

In the conventional multilayer piezoelectric elements, the attempts to form uniform metal layers have been made so as to uniformly apply an electric field to all of the piezoelectric bodies as described above. Particularly, in order to equalize the conductivities of the respective metal layers, and equalize the surface areas of portions connected to the piezoelectric layers, attempts to equalize the metal filling rates of the metal layers have been made. Therefore, the stress caused by displacement concentrates at the outer periphery of the center in the stacking direction of the multilayer piezoelectric element, thereby contributing to the drawbacks such as the occurrence of cracks.

To overcome this, the methods as described in the above Patent Document 4 and 5 have been employed, however, the multilayer piezoelectric elements are now often used under severe conditions of a long-term continuous driving in high electric field and high pressure. It therefore cannot be said that these methods are sufficient under such severe conditions. That is, the stress might concentrate at the outer periphery of the center of the element, and cracks and flaking might occur, causing variations in displacement. This problem is more likely to occur particularly in the multilayer piezoelectric elements of the simultaneous sintering type, and the multilayer piezoelectric elements of the type in which at least part of the outer periphery of the piezoelectric body is restricted.

In some cases, resonance phenomenon that the displacement behaviors of the respective piezoelectric layers match with each other is generated which may cause hum sound, and harmonic signals of integral multiples of a driving frequency are generated which may constitute noise component.

Additionally, when the conventional multilayer piezoelectric elements are used as actuators for use in driving elements such as fuel injectors, the actuators suffer from a gradual change in the desired displacement. It therefore becomes necessary to suppress displacement changes and improve durability in the long-term continuous driving.

In view of the foregoing problems, it is a main advantage of the present invention to provide a multilayer piezoelectric element and an injector which are capable of suppressing displacement changes even when they are continuously driven for a long term under high voltage and high pressure, and have excellent durability.

It is other advantage of the present invention to provide a multilayer piezoelectric element and an injector which are capable of suppressing noise generation due to the resonance phenomenon.

Means for Solving the Problems

The present inventors have made tremendous research effort to solve the abovementioned problems and have completed the present invention based on the following new fact.

That is, a multilayer piezoelectric element having excellent durability and causing no change in displacement even when it is continuously driven for a long term under high voltage and high pressure can be attained by disposing a plurality of high resistance metal layers having a higher electrical resistance than adjacent oppositely disposed metal layers.

Specifically, a multilayer piezoelectric element according to the present invention is composed of a plurality of piezoelectric layers and a plurality of metal layers are alternately stacked one upon another, and the metal layers includes a plurality of high resistance metal layers having a higher electrical resistance than adjacent metal layers on the both sides.

Preferably, the high resistance metal layers are arranged so as to interpose a plurality of different metal layers other than the high resistance metal layers, respectively. More preferably, the high resistance metal layers are arranged regularly. Preferably, the high resistance metal layers have an internal void ratio higher than a void ratio of the different metal layers. Preferably, the high resistance metal layers contain a high resistance component having a higher electrical resistance than the different metal layers, and have a larger high resistance component content than the different metal layers. Preferably, the high resistance metal layers have a smaller thickness than the different metal layers. Preferably, the electrical resistance of the high resistance metal layers is $1/10$ to 1000 times greater than that of the piezoelectric layers. More preferably, the electrical resistance of the high resistance metal layers is at least 1000 times greater than that of the different metal layers.

In other multilayer piezoelectric element of the present invention in which a plurality of piezoelectric layers and a plurality of metal layers are alternately stacked one upon another, at least one layer of the metal layers is formed by a plurality of partial metal layers interposed between the piezoelectric layers.

Preferably, the portions of the partial metal layers are connected at both ends in thickness directions of the partial metal layers to adjacent oppositely disposed piezoelectric layers, respectively, and the remaining portions of the partial metal layers are connected at only one end in the thickness directions of the partial metal layers to the piezoelectric layers, respectively.

Preferably, there are further provided with a plurality of metal layers composed of the partial metal layers. Preferably, the plurality of metal layers composed of the partial metal layers are arranged so as to interpose the piezoelectric layers, respectively. Preferably, the metal layers composed of the partial metal layers are arranged regularly. Preferably, the partial metal layers have one of a gradual decrease and a gradual increase in width with decreasing distance to the piezoelectric layers adjacent to the metal layers composed of the partial metal layers. Preferably, the partial metal layers are composed of one selected from the group consisting of silver, palladium and an alloy of these. Preferably, there are voids between the partial metal layers adjacent to each other. Preferably, a pair of external electrodes with the metal layers connected thereto are formed on side surfaces of a stacked body, respectively.

An injector of the present invention includes a container having an injection hole and a multilayer piezoelectric element as described above. A liquid filled in the container is discharged from the injection hole by the driving of the multilayer piezoelectric element.

Effects of the Invention

In accordance with the multilayer piezoelectric element of the present invention, a plurality of the metal layers include a plurality of the high resistance metal layers having a higher electrical resistance than the adjacent oppositely disposed metal layers, thereby reducing the displacements of the piezoelectric layers connected to the high resistance metal layers. By the presence of these piezoelectric layers causing a small displacement in the multilayer piezoelectric element, the distribution of stress caused by the displacement can be dispersed so as to suppress the occurrence of cracks. If a crack occurs, the crack propagation can be suppressed. Consequently, even in a long-term continuous driving under high voltage and high pressure, the displacement change can be suppressed, enabling the provision of the multilayer piezoelectric element having excellent durability and high reliability.

In accordance with other multilayer piezoelectric element of the present invention, at least one layer of a plurality of the metal layers is formed by a plurality of the partial metal layers disposed between the piezoelectric layers. Therefore, when the piezoelectric layers cause displacements, the metal layer formed by the partial metal layers can absorb the stress generated by the displacements. By the presence of the metal layer formed by the partial metal layers, the degree of freedom of the piezoelectric layers around the metal layer can be increased, permitting large displacements of the piezoelectric layers. Thus, the element deformation due to the stress concentration can be relaxed, and the stress concentration due to the element deformation can be suppressed. This permits a large displacement, suppressing the resonance phenomenon. Even in a long-term continuous driving under high electric field and high pressure, the displacement changes can be suppressed to attain the multilayer piezoelectric element having excellent durability.

The multilayer piezoelectric element of the present invention has substantially no displacement change, enabling the provision of the injector having excellent durability and high reliability.

BRIEF DESCRIPTION OF THE DRAWINGS

FIG. 1(a) is a perspective view showing a multilayer piezoelectric element according to an embodiment of the present invention; FIG. 1(b) is a partial perspective view showing a stacked state of piezoelectric layers and metal layers in FIG. 1(a);

FIG. 3(a) is a perspective view showing a multilayer piezoelectric element according to other embodiment of the present invention; FIG. 3(b) is a partial perspective view showing a stacked state of piezoelectric layers and metal layers in FIG. 3(a);

FIG. 6(a) is a perspective view showing a conventional multilayer piezoelectric element; and FIG. 6(b) is a partial perspective view showing the stacked state of piezoelectric layers and metal layers in FIG. 6(a).

PREFERRED EMBODIMENTS FOR CARRYING OUT THE INVENTION

Multilayer Piezoelectric Elements

First Preferred Embodiment

Figure 2:
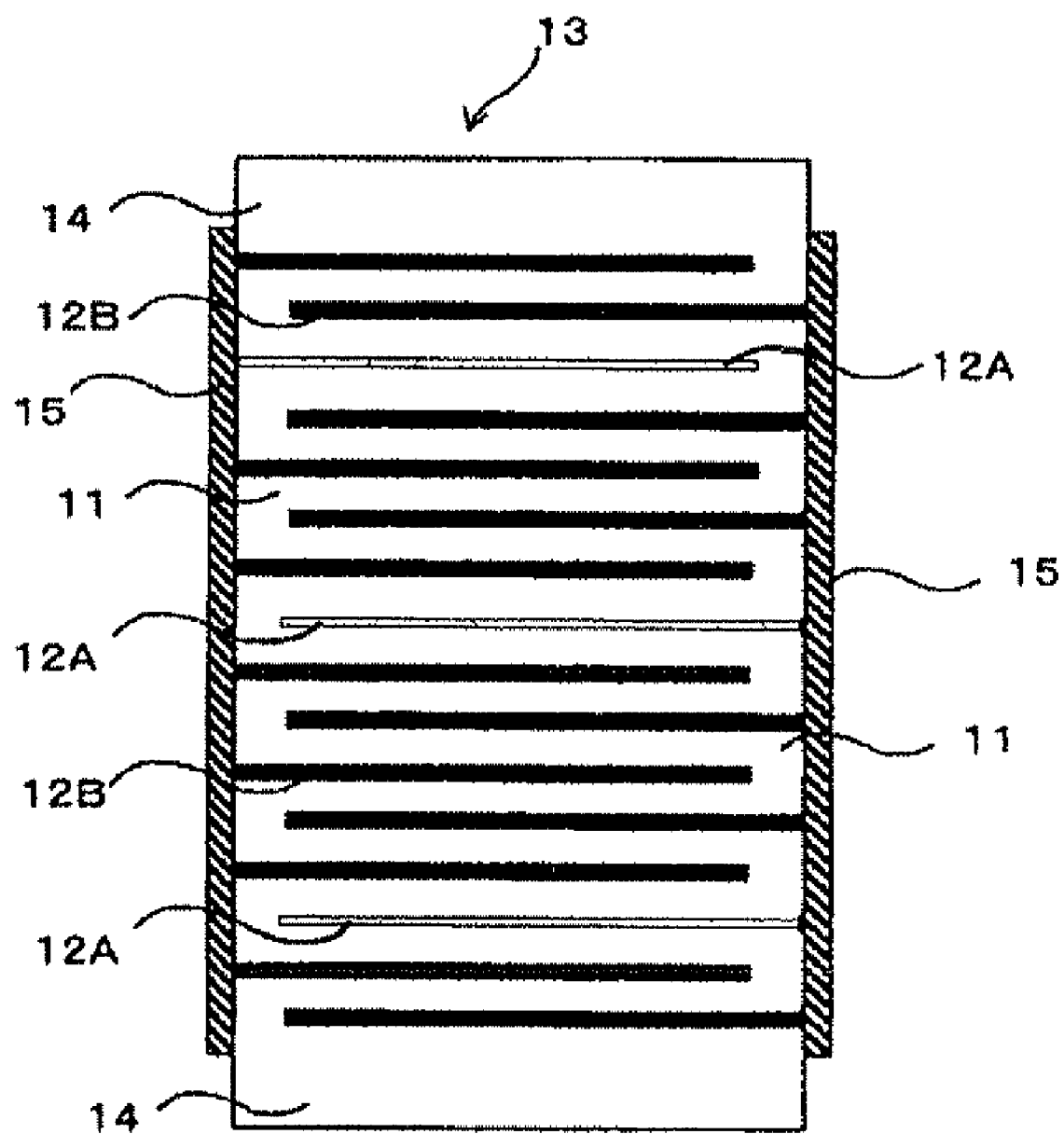
FIG. 2 is a sectional view showing a stacked structure of the piezoelectric element according to a first preferred embodiment.

A multilayer piezoelectric element according to a first preferred embodiment of the present invention will be described in detail with reference to the accompanying drawings. FIG. 1(a) is a perspective view showing a multilayer piezoelectric element according to the present embodiment, and FIG. 1(b) is a partial perspective view showing the stacked state of piezoelectric layers and metal layers in the multilayer piezoelectric element. FIG. 2 is a sectional view showing the stacked structure of the metal layers connected to the piezoelectric layers of the multilayer piezoelectric element according to the present embodiment.

As shown in FIG. 1, the multilayer piezoelectric element has a stacked body 13 configured by alternately stacking a plurality of piezoelectric layers 11 and a plurality of metal layers 12. A pair of external electrodes 15 are connected in electrical communication to the ends of the metal layers 12 exposed to the opposed side surfaces of the stacked body 13, respectively. Inactive layers 14 formed by the piezoelectric layers 11 are stacked on both ends in the stacking direction of the stacked body 13.

When the multilayer piezoelectric element of the present embodiment is used as a piezoelectric actuator, lead wires (not shown) may be connected and secured by soldering to the external electrodes 15, respectively, and the lead wires may be connected to an external voltage supply part (not shown), respectively. Although the metal layers 12 are disposed between the piezoelectric layers 11, the metal layers 12 are formed by a metal material such as silver-palladium or the like, and therefore have the function of applying a predetermined voltage through the metal layers 12 to each of the piezoelectric body 11 so as to cause the piezoelectric layers 11 to be displaced by inverse piezoelectric effect.

The inactive layers 14 are formed by a stacked body in which a plurality of piezoelectric layers are stacked one upon another, and only one main surface thereof is provided with the metal layer 12, thus causing no displacement under application of the voltage.

In the multilayer piezoelectric element of the present embodiment, as shown in FIG. 2, a plurality of the metal layers 12 include a plurality of high resistance metal layers 12A having a higher electrical resistance than adjacent oppositely disposed metal layers, and these high resistance metal layers 12A are arranged so as to interpose different metal layers 12B other than the high resistance metal layers 12A. That is, the plurality of metal layers 12 consist of the plurality of metal layers 12B and the plurality of metal layers 12A having a higher electrical resistance than the metal layers 12B.

In the conventional multilayer piezoelectric elements, substantially uniform metal layers 12 are formed so that an electric field can be applied uniformly to all of piezoelectric layers 11. Therefore, during driving, the element itself continuously causes changes in dimension, and all of the piezoelectric bodies 11 are driven closely through the metal layers 12, so that the overall piezoelectric element will be drivingly deformed. As a result, the stress due to the deformation of the element is concentrated at the outer periphery of the center of the element which expands at the time of compression and necks at the time of spreading. When this multilayer piezoelectric element is subjected to a long-term continuous driving under high electric field and high pressure, the stacked portion (the interface between the piezoelectric layer and the metal layer) might be flaked off, or a crack might occur.

By arranging the plurality of high resistance metal layers 12A as in the present embodiment, the stress generated by displacements can be dispersed. It is therefore possible to suppress the occurrence of cracks and reduce the change in displacement, thereby improving durability even in a long-term continuous driving under high electric field and high pressure.

More specifically, the piezoelectric layers 11 connected to the high resistance metal layers 12A cause a small displacement than the piezoelectric layers 11 connected to the different metal layers 12B. That is, there are a plurality of the piezoelectric layers 11 causing a small displacement. This produces a state in which a plurality of regions divided by the high resistance metal layers 12A are drivingly deformed, respectively, instead of a state in which the overall element is drivingly deformed. As a result, the stress, which has conventionally been concentrated at the center of the element, can be dispersed for each of the plurality of regions in the element of the present embodiment, thereby attaining excellent durability under high electric field and high pressure. Additionally, even if the stacked portion is partially flaked off, or a crack occurs, the piezoelectric body 11 causing a small displacement can suppress the crack propagation. For the above reasons, it seems to be able to obtain the element with the improved durability and high reliability.

As the number of the high resistance metal layers 12A is increased, the stress can be further dispersed and the durability is further improved. However, too large number of the layers 12A tends to decrease the displacement, and it is therefore preferably not more than 20% of the total number of the piezoelectric layers 11.

Preferably, the high resistance metal layers 12A are arranged regularly in the stacking direction of the multilayer piezoelectric element. A plurality of the high resistance metal layers are arranged regularly in the stacking direction so that a plurality of the different metal layers 12B are interposed between the high resistance metal layers 12A. This enables the stress generated by displacement to be almost uniformly dispersed in the portions divided by the high resistance metal layers 12A, respectively. Thus, the stress can be designedly dispersed so as to suppress the occurrence of cracks and the variations in displacement during driving, thereby improving durability.

The above expression that "a plurality of the high resistance metal layers are arranged regularly" is the concept including the case where the layer number of the different metal layers 12B existing between the high resistance metal layers 12A and 12A is identical for each pair of the high resistance metal layers 12A, as well as the case where the layer number of the different metal layers 12B existing between the high resistance metal layers 12A and 12A approaches such a degree that the stress can be dispersed almost uniformly in the stacking direction. Specifically, the layer number of the different metal layers 12B existing between the high resistance metal layers 12A is within ±20% with respect to the average value of the respective layer numbers, preferably within ±10% with respect to the average value of the respective layer numbers, and more preferably all be identical number.

The internal void ratio of the high resistance metal layers 12A is 1.5 to 30 times, preferably 5 to 20 times greater than the void ratio of the different metal layers 12B. By so doing, the displacements of the piezoelectric layers 11 connected to the high resistance metal layers 12A become smaller than the displacements of the piezoelectric layers 11 whose both main surfaces are connected to the different metal layers 12B. The regions divided by the piezoelectric layers 11 causing a small displacement have a smaller displacement than the entire multilayer piezoelectric element. This enables suppression of cracks to be generated in the outer periphery of the multilayer piezoelectric element, thereby improving durability. In addition, a high void ratio enables stress to be absorbed, thereby further improving durability.

The void ratio of the high resistance metal layers 12A is 40% to 99%, preferably 50% to 90%. When the void ratio is below 40%, the electrical resistance of the metal layers will not be increased, and the displacements of the piezoelectric layers 11 connected thereto might not be sufficiently reduced. On the other hand, when the void ratio is above 99%, the strengths of the high resistance metal layers 12A are lowered, and the high resistance metal layers 12A might be easily broken.

The void ratio is measured on a cross section obtained by cutting the multilayer piezoelectric element by a plane parallel to the stacking direction, or a plane perpendicular to the stacking direction. Specifically, the void ratio can be obtained by measuring the cross-sectional area of voids in the cross section of the high resistance metal layer 12A, and dividing the obtained cross-sectional area by the cross-sectional area of the high resistance metal layer 12A, and then multiplying the result by 100. Although no special limitation is imposed on the diameter of the voids, it is preferably 3 to 100 μm, more preferably 5 to 70 μm.

The void ratio measuring method can be roughly classified into the following two methods. A first method is the observation of the cross section when the stacked body 13 is cut by a plane parallel to the stacking direction. A second method is the observation of the cross section when the stacked body 13 is cut by a plane perpendicular to the stacking direction. The void ratio of the present invention may be measured by either of these methods.

The void ratio measurement by the first method may be carried out as follows. Firstly, by known polishing means, the stacked body 13 is polished so that the cross section parallel to the stacking direction is exposed. For example, the stacked body 13 can be polished with diamond paste by using, as a polisher, a bench polisher KEMET-V-300, manufactured by Kemet Japan Co., Ltd. The cross section exposed by this polishing process is observed by, for example, a scanning electron microscope (SEM), an optical microscope, a metal microscope, etc, thereby obtaining a cross section image. The void ratio of the metal layers can be determined by performing image processing of the cross section image. As a specific example, on the image of the metal layers taken by the optical microscope, void portions are colored in black, and the portions other than the voids are colored in white. Then, the ratio of the black portions, namely, (the area of the black portions)/(the area of the black portions plus the area of the white portions), is found, and the void ratio can be calculated by expressing the result as a percentage. For example, when the cross section image is a color image, it may be converted to gray scales and divided into black portions and white portions. At this time, if required to set the threshold value of a boundary for two gradations of black portions and white portions, binarization may be carried out, setting the threshold value of the boundary by image processing software and visual observation.

The void ratio measurement by the second method may be carried out as follows. Firstly, using a known polisher, the stacked body 13 is polished until a cross section of the metal layer whose void ratio measurement is desired (a cross section perpendicular to the stacking direction) is exposed. For example, the stacked body 13 can be polished with diamond paste by using, as a polisher, the bench polisher KEMET-V-300, manufactured by Kemet Japan Co., Ltd. The cross section exposed by this polishing process is observed by, for example, a scanning electron microscope (SEM), an optical microscope, a metal microscope, etc, thereby obtaining a cross section image. The void ratio of the metal layers can be determined by performing image processing of the cross section image. Specifically, on the image of the metal layers taken by the optical microscope, void portions are colored in black, and the portions other than the voids are colored in white. Then, the ratio of the black portions, namely, (the area of the black portions)/(the area of the black portions plus the area of the white portions), is found, and the void ratio can be calculated by expressing the result as a percentage. For example, when the cross section image is a color image, it may be converted to gray scales and divided into black portions and white portions. At this time, if required to set the threshold value of a boundary for two gradations of black portions and white portions, binarization may be carried out, setting the threshold value of the boundary by image processing software and visual observation.

When observing the cross sections of the metal layers, it is preferable to perform the polishing so as to reduce their thicknesses to substantially a half, and observe the cross section so exposed. However, if the metal layers have a small thickness and relatively large thickness variations, the entire cross section of the metal layers may not be exposed by polishing process. In such a case, at the point that the polishing process is performed until portions of the metal layers are exposed, the exposed portions are observed to obtain a cross section image. Thereafter, the polishing is advanced, and the portions except for the observed portions may be observed. This operation may be repeated a plurality of times. Thus, the observed images obtained by performing the above operation a plurality of times may be combined together in order to observe the entire cross section of the metal layers.

Preferably, the high resistance metal layers 12A contain a larger amount of a high resistance component having a high electrical resistance than the different metal layers 12B. Specifically, the high resistance component content of the high resistance metal layers 12A is 1.5 to 20 times, preferably 2 to 10 times greater than that of the different metal layers 12B. By incorporating such a large amount of the high resistance component into the high resistance metal layers 12A, the metal layers having a high electrical resistance can be formed even if the amount of voids is substantially reduced. The arrangement of a plurality of the high resistance metal layers 12A thus formed can also reduce the amount of variations in displacement.

Examples of the high resistance component are Pd, Pt, Cr, Ni, Mo and W. Although no special limitation is imposed on the particle size of the high resistance component, it is preferably 0.1 to 100 μm, more preferably 0.1 to 50 μm.

The high resistance component content in the high resistance metal layers 12A is preferably 40% to 99%, more preferably 50 to 90%. The high resistance component content can be calculated by the following steps of: taking an SEM photograph of a plane parallel to the high resistance metal layer 12A; measuring the area of the high resistance component in the plane; dividing the obtained area by the area of the entire photographed surface; and multiplying the result by 100.

The thicknesses of the high resistance metal layers 12A are preferably smaller than the thicknesses of the different metal layers 12B. The high resistance metal layers 12A having a smaller thickness than the different layers 12B are easier to be deformed than the different metal layers 12B, so that the stress generated in the piezoelectric layers 11 adjacent to the high resistance metal layers 12A can be reduced, resulting in improved durability. When the high resistance metal layers 12A have a smaller thickness than the different layers 12B, the metal layers are easy to deform and absorb stress, and they are hard to be flaked off, resulting in improved durability.

The thicknesses of the metal layers 12A and 12B are measured on a plane cut in the stacking direction of the multilayer piezoelectric element. Arbitrary five locations of the different metal layer 12B are selected, and the thickness between arbitrary two parallel lines is measured. Specifically, one of the two parallel lines is set on the boundary between the metal layer and the piezoelectric layer, and the other line is shifted to another boundary. Then, the distance between the two parallel lines is measured. A similar measurement is made for the high resistance metal layer 12A to determine its thickness. Although no special limitation is imposed on the thickness of the high resistance metal layer 12A, it is preferably 30 to 0.1 μm, and more preferably 20 to 1 μm. The thickness of the different metal layer 12B is preferably not less than 103%, more preferably not less than 110% to that of the high resistance metal layer 12A. As a method of selecting five locations at which the thickness of the metal layer is measured, for example, there is the following method. That is, on a cross section cut in the stacking direction of the multilayer piezoelectric element, five locations are selected which consist of both ends in the width direction of the metal layer, a half position in the width direction, and two locations at one fourth positions from the opposite ends in the width direction, respectively.

It is further preferable in the present invention that the electrical resistance of the high resistance metal layer 12A be $\frac{1}{10}$ to 1000 times greater than that of the piezoelectric layer 11. Within this range, the displacement of the piezoelectric layer 11 connected to the high resistance metal layer 12A can be controlled suitably. Under the condition that the electrical resistance of the high resistance metal layer 12A is at least $\frac{1}{10}$ times greater than that of the piezoelectric layer 11, the displacement of the piezoelectric layer 11 connected to the high resistance metal layer 12A can be smaller than that of other piezoelectric layer 11, thereby attaining sufficient stress dispersing effect. Under the condition that the electrical resistance of the high resistance metal layer 12A is not exceeding 1000 times greater than that of the piezoelectric layer 11, it is avoidable that the displacement of the piezoelectric layer 11 connected to the high resistance metal layer 12A becomes too small, thereby preventing excess stress concentration. It is therefore more preferable that the electrical resistance of the high resistance metal layer 12A be 1 to 1000 times greater than that of the piezoelectric layer 11.

The electrical resistance (Q) in the present invention can be measured as follows. That is, using a pico-ampere meter (for example, 4140B, manufactured by Hewlett-Packard Company), measurements are made in each layer by applying probes to both ends of the high resistance metal layer 12A or the both ends of the piezoelectric layer 11, respectively. As used here, "the both ends of the high resistance metal layer 12A" means the ends of the high resistance metal layer 12A exposed to the two opposed side surfaces (the portion where external electrodes 15 is not formed) of the stacked body 13, respectively. If the ends of the high resistance metal layer 12A are not exposed to the side surfaces of the stacked body 13, polishing may be performed with a known polisher or the like until the ends of the high resistance metal layer 12A are exposed. Thereafter, the electrical resistance is measured by applying the probes of the pico-ampere meter to the both ends of the high resistance metal layer 12A, respectively. The proper temperature when measuring the electrical resistance may be 25° C.

Preferably, the electrical resistance of the high resistance metal layer 12A is at least 1000 times greater than that of the different metal layer 12B. This ensures that the displacement of the piezoelectric layer 11 connected to the high resistance metal layer 12A is smaller than that of the piezoelectric layer 11 connected to the different metal layer 12B. Hence, the multilayer piezoelectric element can be sectioned by the high resistance metal layers 12A so as to disperse the stress, resulting in improved durability.

A description will next be made of a method of manufacturing the multilayer piezoelectric element according to the present embodiment.

Firstly, slurry is prepared by mixing the calcinated powder of piezoelectric ceramics of peroviskite-type oxide composed of $PbZrO_3$—$PbTiO_3$ or the like, binder composed of acrylic-based or butyral-based organic high polymer, and plasticizer such as DBP (dibutyl phthalate), DOP (dioctyl phthalate) or the like. The slurry is then subjected to a known tape forming method such as doctor blade method or calendar roll, thereby obtaining ceramic green sheets for forming the piezoelectric layers 11.

Subsequently, conductive paste is prepared by containing an organic matter such as acryl beads, which are bindingly fixed during drying, and volatilized during sintering, in metal powder composing the high resistance metal layers 12A, such as silver-palladium, and by adding and mixing binder and plasticizer. The conductive paste is then printed in a thickness of 1 to 40 μm on the upper surfaces of part of the above green sheets by screen printing or the like.

Here, the void ratio of the high resistance metal layers can be changed by changing the ratio of the acryl beads and the metal powder. That is, a large amount of the acryl beads will increase the void ratio, and a small amount of the acryl beads will decrease the void ratio. The diameter of the voids can be controlled by changing the diameter of the beads.

The following another printing method may be employed. That is, acryl beads paste is prepared by adding an organic matter, such as acryl beads, to binder and plasticizer, and then mixing together. Separately, conductive paste is prepared by adding binder and plasticizer to metal powder such as silver-palladium, and then mixing together. The acryl beads paste and the conductive paste are stackingly printed on the upper surfaces of the part of the above green sheets by screen printing or the like. This printing method enables printing having excellent productivity.

Alternatively, the metal layers of the silver-palladium or the like may be heated so as to temporarily oxidize the surfaces thereof. This makes it easy to control the void ratio of the high resistance metal layers 12A. Further, a high resistance component such as PZT, lead titanate or alumina may be added to the metal layers of silver-palladium or the like.

On the green sheets other than those on which the high resistance metal layers 12A are formed, conductive paste for forming the different metal layers 12B is printed by screen printing or the like. An organic matter such as acryl beads and a high resistance component may be added to the conductive paste as needed.

Subsequently, a plurality of the green sheets with the conductive paste printed thereon are stacked one upon another, thereby obtaining a stacked body. The stacked body with a weight mounted thereon is debindered at a predetermined temperature. Thereafter, this is sintered at 900 to 1200° C. without mounting any weight thereon so that voids can be formed in the high resistance metal layers 12A, thereby obtaining the stacked body 13.

At this time, metal powder composing the metal layers 12 such as silver-palladium may be added into the green sheets corresponding to the inactive layers 14. Alternatively, when stacking the green sheets corresponding to the inactive layers 14, slurry consisting of metal powder composing the metal layers 12, such as silver-palladium, and an inorganic compound, binder and plasticizer may be printed on the green sheets. As a result, the shrinkage behavior and the shrinkage during sintering of the inactive layers 14 and those of other portions can be matched with each other, thereby forming the dense stacked body 13.

The stacked body 13 should not be limited to that manufactured by the above manufacturing method, and it may be formed by any manufacturing method capable of forming the stacked body 13, in which a plurality of the piezoelectric bodies 11 and a plurality of the metal layers 12 are stacked alternately.

Thereafter, the metal layer 12 whose end is exposed to the side surface of the multilayer piezoelectric element, and the metal layer 12 whose end is not exposed thereto are alternately formed. Then, a groove is formed in a piezoelectric portion between the metal layer 12 whose end is not exposed, and the external electrodes 15. An insulator of resin or rubber, having a lower Young's modulus than the piezoelectric body 11, is formed in the groove. Here, the groove is formed on the side surface of the stacked body 13 by using an internal dicing device or the like.

Next, silver glass conductive paste is prepared by adding binder to glass powder. This is formed in a sheet, and the raw density of the sheet after drying (causing the solvent to vapor) is controlled to 6 to 9 $g/cm^3$. This sheet is then transferred onto the surface of the columnar stacked body 13 on which external electrodes should be formed, followed by baking at a temperature that is higher than the softening point of glass, and below the melting point of silver (965° C.), and below fourth five of the sintering temperature (° C.) of the stacked body 13. This enables splash and elimination of the binder composition in the sheets manufactured by using the silver glass conductive paste, thereby forming the external electrodes 15 composed of porous conductive material having a three-dimensional mesh structure.

Here, the paste composing the external electrodes 15 may be stacked one upon another on a multilayer sheet and then baked, or alternatively stacked and then baked per layer. It is however excellent in mass production to perform baking at a time after stacking on the multilayer sheet. In the case of changing the glass composition layer by layer, the amount of the glass composition may be changed sheet by sheet. If desired to form an extremely thin glass rich layer on the surface most adjacent to the piezoelectric body 11, a glass rich paste may be printed on the stacked body 13 by screen printing or the like, and a multilayer sheet may be stacked thereon. Instead of the printing, a sheet of not more than 5 μm may be used.

The baking temperature of the above silver glass conductive paste is desirably 500 to 800° C., from the following points: (i) a neck portion (the portion where crystal grains are collected) is effectively formed; (ii) the silver in the silver glass conductive paste and the metal layer 12 are diffusedly connected to each other; (iii) the voids in the external electrodes 15 are effectively retained; and (iv) the external electrodes 15 and the side surfaces of the columnar stacked body 13 are partially connected to each other. The softening point of the glass composition in the silver glass conductive paste is desirably 500 to 800° C. By the presence of the neck portion, the sintered body can have a meshed structure including suitable spacings, without becoming too dense sintered body.

When the baking temperature is higher than 800° C., the sintering of silver powder of the silver glass conductive paste is too advanced, and the porous conductive material having a three-dimensional mesh structure cannot be formed, so that the external electrodes 15 are too dense. As a result, the Young's modulus of the external electrodes 15 is too high, and the stress during driving cannot be absorbed sufficiently, so that the external electrodes 15 might be disconnected. Preferably, the baking is performed at temperatures within 1.2 times of the glass softening point.

On the other hand, when the baking temperature is lower than 500° C., a sufficient diffused connection between the ends of the metal layers 12 and the external electrodes 15 cannot be made, and no neck portion can be formed, which might cause spark between the metal layer 12 and the external electrodes 15 during driving.

Next, silicone rubber is filled into the groove of the stacked body 13 by immersing the stacked body 13 provided with the external electrodes 15 in a silicone rubber solution, and then deaerating the silicone rubber solution in the vacuum. The stacked body 13 is then lifted from the silicone rubber solution, and the silicone rubber is coated on the side surfaces of the stacked body 13. The silicone rubber, which has been filled into the groove and also coated on the side surfaces of the stacked body 13, is then cured, resulting in the multilayer piezoelectric element of the present invention.

Subsequently, the polarization processing of the stacked body 13 is performed by connecting lead wires to the external electrodes 15, respectively, and then applying a dc voltage of 0.1 to 3 kV/mm through the lead wires to a pair of the external electrodes 15, respectively. This results in a piezoelectric actuator using the multilayer piezoelectric element of the present invention. By connecting the lead wires to an external voltage supply part, respectively, and applying a voltage to the metal layers 12 through the lead wires and the external electrodes 15, the respective piezoelectric body 11 are greatly displaced by the reverse piezoelectric effect, thereby functioning as, for example, an automobile fuel injection valve for performing fuel injection supply to the engine.

Alternatively, a conductive auxiliary member composed of conductive adhesive, in which a metal mesh or a mesh-shaped metal plate is buried, may be formed on the outer surfaces of the external electrodes 15. In this case, when a large current is inputted into the actuator so as to be driven at high speed by disposing the conductive auxiliary member on the outer surfaces of the external electrodes 15, the large current can be admitted in the conductive auxiliary member, reducing the current passing through the external electrodes 15. For this reason, it is possible to prevent that the external electrodes 15 will locally generate heat and cause disconnection, enabling significant improvement of durability. Additionally, since the metal mesh or the mesh-shaped metal plate is buried in the conductive adhesive, it is possible to prevent the occurrence of cracks in the conductive adhesive. As used herein, the term "metal mesh" means one in which metal lines are knitted, and the term "mesh-shaped metal plate" means one in which holes are formed in a metal plate so as to have the shape of a mesh.

Preferably, the conductive adhesive constituting the conductive auxiliary member is composed of polyimide resin in which silver powder is dispersed. That is, by dispersing silver powder having a low specific resistance into polyimide resin having high thermal resistance, it is possible to form a conductive auxiliary member having a low resistance value and maintaining high adhesive strength if used at high temperature.

More preferably, the conductive particles are aspherical particles such as flake shape and needle shape. The reason for this is as follows. That is, by changing the shape of the conductive particles into particles of aspherical shape such as flake shape and needle shape, the entanglement between the conductive particles can be made strong, further increasing the shear strength of the conductive adhesive.

Second Preferred Embodiment

A multilayer piezoelectric element according to a second preferred embodiment of the present invention will be described in detail. FIG. 3(a) is a perspective view showing the multilayer piezoelectric element according to the present embodiment, and FIG. 3(b) is a partial perspective view showing the stacked state of piezoelectric layers and metal layers in FIG. 3(a).

As shown in FIGS. 3(a) and 3(b), the multilayer piezoelectric element of the present embodiment has a stacked body 23 configured by alternately stacking a plurality of piezoelectric layers 21 and a plurality of metal layers 22a and 22b (in some cases, hereinafter referred generally to "metal layers 22"). A pair of external electrodes 25 (one of which is not shown) are provided on the opposed side surfaces of the stacked body 23, respectively. The respective metal layers 22 are not formed entirely over the main surfaces of the piezoelectric layers 21, thereby forming a so-called partial electrode structure. The metal layers 22 in the partial electrode structure are arranged so as to be exposed by every other layer to the opposed side surfaces of the stacked body 23. This enables the metal layers 22 to be electrically connected by every other layer to a pair of the external electrodes 25.

Inactive layers 24 formed by a piezoelectric body are stacked one upon another on both ends in the stacking direction of the stacked body 23. When the multilayer piezoelectric element is used as a piezoelectric actuator, lead wires may be connected and secured by soldering to the external electrodes 25, respectively, and the lead wires may be connected to an external voltage supply part, respectively. By applying a predetermined voltage from the external electrode supply part through the lead wires to between the adjacent metal layers 22, the respective piezoelectric layers 21 are displaced by the reverse piezoelectric effect. On the other hand, the inactive layers 24, one main surface of which is provided with the metal layer 22 and the other main surface is not provided with the metal layer 22, thus causing no displacement under application of the voltage.

In the multilayer piezoelectric element of the present embodiment, as shown in FIGS. 3(a) and 3(b), at least one layer of the plurality of the metal layers 22 is the metal layer 22b consisting of a plurality of partial metal layers 22c disposed between the piezoelectric layers 21. The presence of at least one metal layer 22b can increase the displacement of the entire multilayer piezoelectric element, and also improve the durability of the multilayer piezoelectric element.

That is, as in the conventional multilayer piezoelectric elements, when all of metal layers are formed nearly uniformly in order to uniformly apply an electric field to all of piezoelectric bodies, the element itself continuously causes changes in dimension during driving. Therefore, all of the piezoelectric bodies are driven closely through the metal layers, so that the overall piezoelectric element will be drivingly deformed. Accordingly, the stress due to the deformation of the element is liable to be concentrated at the outer periphery of the center of the element which expands at the time of compression and necks at the time of spreading. In particular, the stress tends to be concentrated on the boundary between an active layer piezoelectrically displaced and an inactive layer not piezoelectrically displaced. There are also the following problems. That is, the resonance phenomenon that the displacement behaviors of the respective piezoelectric layers match with each other are generated which may cause hum sound, and harmonic signals of integral multiples of a driving frequency are generated which may constitute noise composition.

On the contrary, in the multilayer piezoelectric element of the present embodiment, at least one layer of the metal layers 22 is the metal layer 22b, which makes it possible to reduce the displacement of the piezoelectric layer around the metal layer 22b and increase the displacement of the piezoelectric layer 21 around the metal layer 22a. Hence, the region causing a large displacement and the region causing a small displacement can be dispersed within the element. The arrangement of the metal layer in the element makes it possible to disperse the stress exerted on the element. This relaxes the suppression of the element deformation due to the stress concentration, resulting in a large displacement of the entire element. Additionally, the stress concentration due to the element deformation can be suppressed to exhibit excellent durability even in a long-term continuous driving under high electric field and high pressure.

Preferably, a plurality of the partial metal layers 22c composing the metal layer 22b are arranged almost uniformly between the piezoelectric layers 21 and 21. When these partial metal layers 22c are arranged at almost equally spaced intervals between the piezoelectric layers 21 and 21, the stress along with the element deformation will not be concentrated at a part of the element, and the metal layer 22b functions as a stress relaxing layer of the piezoelectric layers over the entire area of the cross section of the element.

In the present embodiment as shown in FIGS. 3(a) and 3(b), there are a plurality of the metal layers 22b in the stacked body 23. These metal layers 22b are interposed in a plurality of the piezoelectric layers 21 and a plurality of the metal layers 22a, and arranged regularly in the thickness direction of the stacked body 23.

Layers to be drivingly deformed in a plurality of the piezoelectric layers 21 are those sandwiched with the metal layers 22a. Therefore, by forming the metal layer 22b at a location in the metal layers 22 where a plurality of the piezoelectric bodies 21 are interposed therebetween, it is possible to ensure a certain amount of the displacement of the element. It is also possible to suppress the resonance phenomenon to be generated when the displacements as the dimensional changes of the elements become identical, thereby preventing hum sound generation. Further, harmonic signal generation can be prevented, thereby suppressing the noise of control signals. Furthermore, by changing the thicknesses of the metal layers 22, the magnitudes of the displacements of the piezoelectric body 11 can be controlled, eliminating the need to change the thicknesses of the piezoelectric body 21. This realizes the structure effective for mass production.

Figure 4:
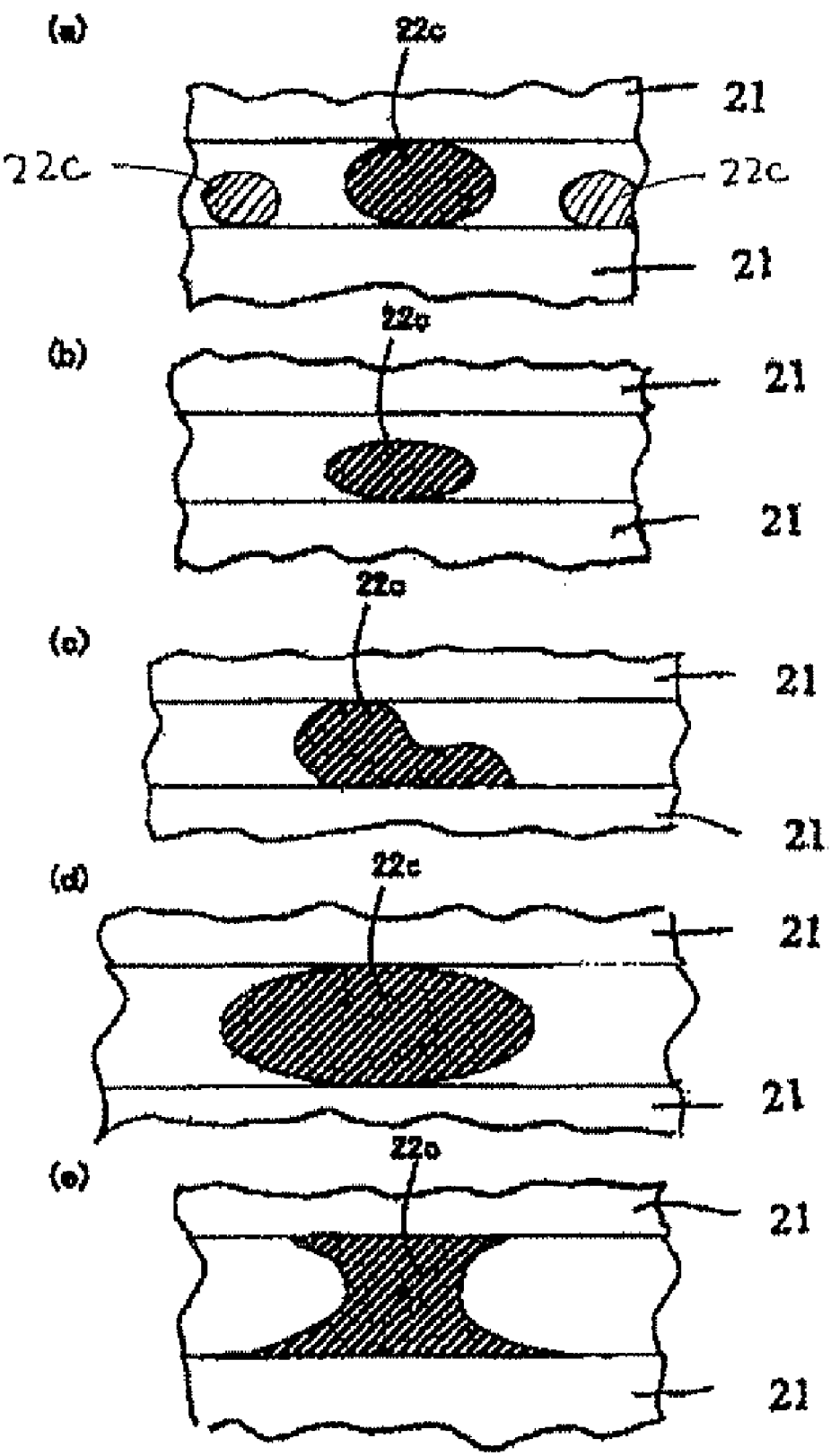
FIGS. 4(a) to 4(e) are enlarged sectional views showing in enlarged dimension the peripheries of partial metal layers disposed between the piezoelectric layers, respectively.

It is further desirable in the present invention that a part of a plurality of the partial metal layers 22c be connected at both ends in the thickness direction thereof to the adjacent oppositely disposed piezoelectric layers 21, respectively (FIG. 4(a)), and the rest of the partial metal layers 22c constituting the metal layers 22b be connected at only one end thereof in the thickness direction of the partial metal layers 22c to the piezoelectric layers 21, respectively (FIG. 4(b)). Like the partial metal layers 22c as shown in FIG. 4(c), substantially the entire surface on one end side thereof may be connected to the piezoelectric layers 21, and only part on the other side may be connected to the piezoelectric layers 21. One of the functions required for the metal layer 22b is to increase the displacement of the multilayer piezoelectric element during driving. This requires that each of the partial metal layers 22c constituting the metal layer 22b be connected at both ends or either end thereof in the thickness direction thereof to the adjacent oppositely disposed piezoelectric layers 21. When both ends in the thickness direction of the partial metal layers 22c constituting the metal layer 22b are unconnected to the adjacent oppositely disposed piezoelectric layers 21, a sufficient spring function of connecting the adjacent piezoelectric layers 21 cannot be imparted, and in some cases, failing to sufficiently obtain the effect of increasing the displacement of the multilayer piezoelectric element during driving.

It is also desirable that in a region proximate to the adjacent piezoelectric layers 21, a plurality of the partial metal layers 22c are gradually decreased in width (FIG. 4(d)) or gradually increased in width (FIG. 4(e)) with decreasing distance to these piezoelectric layers 21, respectively. Here, the other function required for the metal layer 22b is to relax the stress generated when the multilayer piezoelectric element is drivingly displaced. In order to attain this function, it is required to relax the stress generated on the interface between the piezoelectric body 21 and the metal layer 22, without causing the stress to be concentrated at a point. In the present invention, for the purpose of further improving this stress relaxing function, particularly in a region proximate to the adjacent piezoelectric layers 21, the contours of a plurality of the partial metal layers 22c are gradually decreased or increased in width with decreasing distance to these piezoelectric layers 21, respectively, so as to suppress the stress concentrating at a point. Consequently, the piezoelectric body 21 connected to the metal layers 22b are free from stress concentration, resulting in a large displacement. This enables retention of the driving displacement of the element and avoidance of stress concentration at a point in the element. It is therefore capable of providing a piezoelectric actuator having a large displacement, excellent durability and high reliability.

It is desirable that voids exist between a plurality of the partial metal layers 22c adjacent to each other in the metal layers 22b. The reason for this is as follows. In the presence of an insulating material other than the metal component in the metal layers 22b, when the element is driven, a portion to which no voltage can be applied may be generated in the piezoelectric body 21, and in some cases, piezoelectric displacement cannot be increased sufficiently. In addition, the stress during driving is liable to be concentrated.

On the other hand, in the presence of voids between a plurality of the partial metal layers 22c constituting the partial metal layers 22b, when stress is exerted on metal portions, the void portions can cause the partial metal layers 22c to be deformed and dispersedly relax the stress. Additionally, when the piezoelectric body 21 connected to the metal layer 22b are piezoelectrically displaced, the presence of the void portions causes the piezoelectric body 21 to be partially cramped. Thus, the force constraining the piezoelectric body 21 can be reduced than when they are cramped throughout the entire surface. As a result, the piezoelectric layers 21 are easy to deform, resulting in a large displacement. This achieves the multilayer piezoelectric element exhibiting a larger element displacement and high durability.

The stacked body 23 is preferably a polygon cylindrical body. The reason for this is as follows. That is, if the stacked body 23 has a cylindrical shape, the central axis may dislocate unless it is completely rounded. It is therefore necessary to prepare high precision circles and stack them one upon another, making it difficult to use a mass production type manufacturing method using simultaneous sintering. Alternatively, if the outer periphery is polished to a cylindrical shape after stacking substantially circular stacked bodies or after sintering, it becomes difficult to align the central axes of the metal layers 22 with high precision.

On the contrary, if the stacked body 23 is the polygon cylindrical body, the metal layers 22 can be formed on the piezoelectric layers 21 whose reference line is determined. Additionally, these can be stacked one upon another along the reference line, enabling the central axis as the driving axis to be formed with a mass production type manufacturing method. This achieves the element having high durability.

Also in the present invention, the metal composing the metal layers 22b is preferably silver, palladium, or a compound of these. Since these metals have high thermal resistance, it becomes possible to perform simultaneous sintering of the piezoelectric body 21 having a high sintering temperature and the metal layers 22. This permits the manufacture in which the sintering temperature of the external electrodes 25 is set to a lower temperature than the sintering temperature of the piezoelectric body 21, thereby suppressing severe mutual dispersion between the piezoelectric body 21 and the external electrodes 25.

A description will next be made of a method of manufacturing the multilayer piezoelectric element according to the present embodiment. Firstly, slurry is prepared by mixing the calcinated powder of piezoelectrics ceramic of peroviskite-type oxide composed of $PbZrO_3$—$PbTiO_3$ or the like, binder composed of acrylic-based or butyral-based organic high polymer, and plasticizer such as DBP (dibutyl phthalate), DOP (dioctyl phthalate) or the like. The slurry is then subjected to a known tape forming method such as doctor blade method or calendar roll, thereby obtaining ceramic green sheets for forming the piezoelectric body 21.

Subsequently, conductive paste is prepared by adding and mixing binder and plasticizer into metal powder constituting the metal layers 22, such as silver-palladium. The conductive paste is then printed in a thickness of 1 to 40 μm on the upper surface of each of the green sheets by screen printing or the like. The thicknesses of the metal layers 22 and the voids and the like in the metal layers can be changed by changing the ratio of the binder and the plasticizer to the metal powder, or changing the degree of the screen mesh, or changing the thickness of a resist for forming the screen pattern.

Subsequently, a plurality of the green sheets with the conductive paste printed thereon are stacked one upon another, thereby obtaining a stacked body. The stacked body with a weight mounted thereon is debindered at a predetermined temperature. Thereafter, this is sintered at 900 to 1200° C. without mounting any weight thereon so that the metal layers have different thicknesses, resulting in the stacked body 23.

At this time, metal powder composing the metal layer 22 such as silver-palladium may be added into the green sheets corresponding to the inactive layers 24. Alternatively, when stacking the green sheets corresponding to the inactive layers 24, slurry consisting of metal powder composing the metal layers 22, such as silver-palladium, an inorganic compound, binder and plasticizer may be printed on the green sheets. As a result, the shrinkage behavior and the shrinkage during sintering of the inactive layers 24 and those of other portions can be matched with each other, thereby forming the dense stacked body 23.

The stacked body 23 should not be limited to that manufactured by the above manufacturing method, and it may be formed by any manufacturing method capable of forming the stacked body 23, in which a plurality of the piezoelectric bodies 21 and a plurality of the metal layers 22 are stacked alternately.

Next, silver glass conductive paste is prepared by adding binder to glass powder. This is formed in a sheet, and the raw density of the sheet after drying (causing the solvent to vapor) is controlled to 6 to 9 g/cm$^3$. This sheet is then transferred onto the surface of the columnar stacked body 23 on which external electrodes should be formed, followed by baking at a temperature that is higher than the softening point of glass, and below the melting point of silver (965° C.), and below fourth five of the sintering temperature (° C.) of the stacked body 23. This enables vaporization and elimination of the binder composition in the sheets manufactured by using the silver glass conductive paste, thereby forming the external electrodes 25 composed of porous conductive material having a three-dimensional mesh structure.

The baking temperature of the above silver glass conductive paste is desirably 500 to 800° C., as described above. Similarly, the softening point of the glass composition in the silver glass conductive paste is desirably 500 to 800° C.

Then, silicone rubber is filled into the groove of the stacked body 23 by immersing the stacked body 23 provided with the external electrodes 25 in a silicone rubber solution, and then deaerating the silicone rubber solution in the vacuum. The stacked body 23 is then lifted from the silicone rubber solution, and the silicone rubber is coated on the side surfaces of the stacked body 23. The silicone rubber, which has been filled into the groove and also coated on the side surfaces of the stacked body 23, is then cured, resulting in the multilayer piezoelectric element of the present invention.

Subsequently, the polarization processing of the stacked body 23 is performed by connecting lead wires to the external electrodes 25, respectively, and then applying a dc voltage of 0.1 to 3 kV/mm through the lead wires to the pair of the external electrodes 25, respectively. This results in a piezoelectric actuator using the multilayer piezoelectric element of the present invention. By connecting the lead wires to an external voltage supply part, respectively, and applying a voltage to the metal layers 22 through the lead wires and the external electrodes 25, the respective piezoelectric layers 21 are greatly displaced by the reverse piezoelectric effect, thereby functioning as, for example, an automobile fuel injection valve for performing fuel injection supply to the engine.

Otherwise, the second preferred embodiment is identical to that described in the first preferred embodiment, and the description thereof will be omitted.

<Injector>

Figure 5:
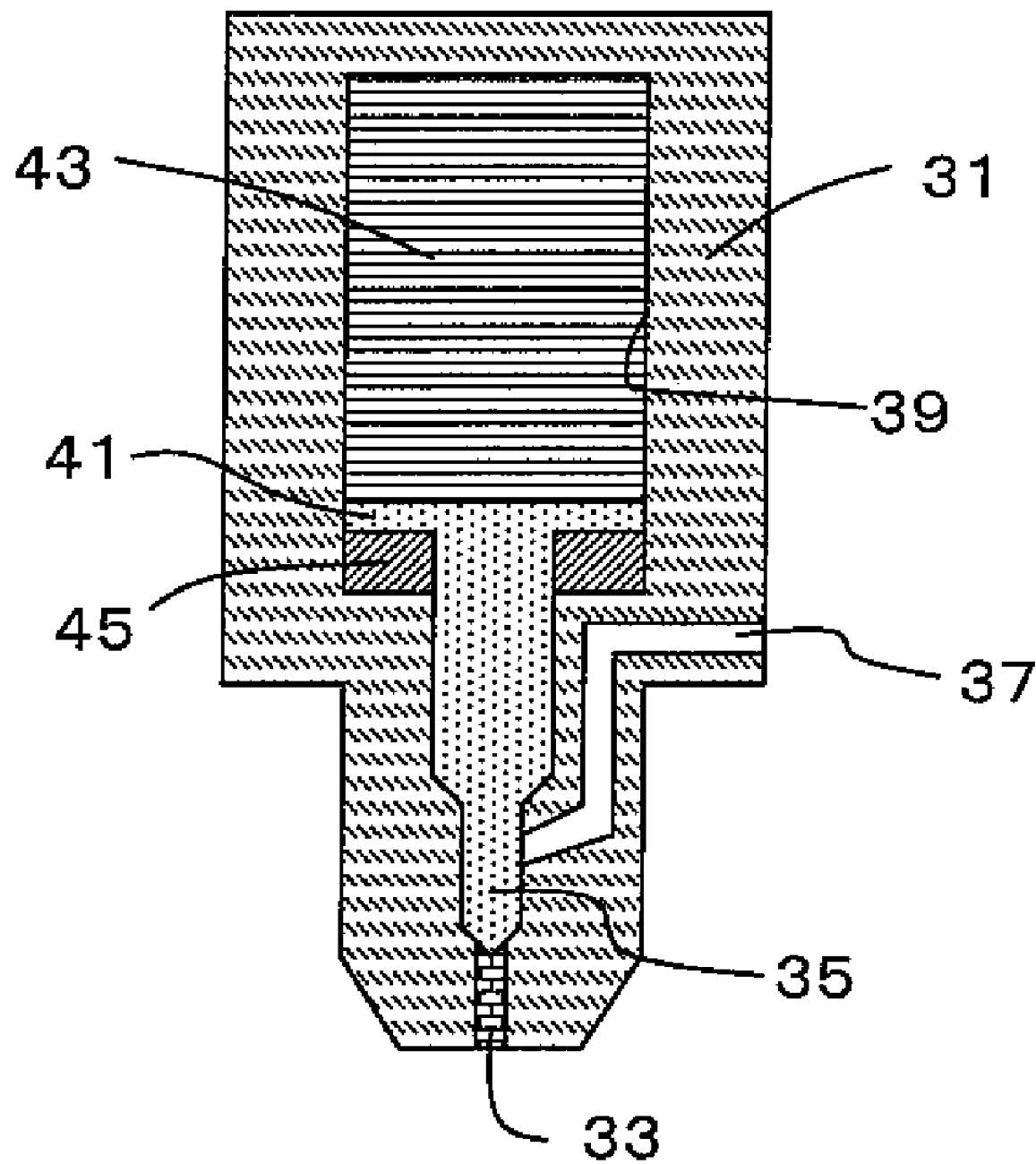
FIG. 5 is a schematic sectional view showing an injector according to an embodiment of the present invention.

FIG. 5 is a schematic sectional view showing an injector according to a preferred embodiment of the present invention. As shown in FIG. 5, in the injector, the multilayer piezoelectric element of the present invention represented by the above embodiment is accommodated in the inside of a container 31 having at one end thereof an injection hole 33. A needle valve 35 capable of opening and closing the injection hole 33 is disposed in the container 31. A fuel passage 37 is disposed in the injection hole 33 so as to permit communication in response to movement of the needle valve 35. The fuel passage 37 is connected to an external fuel supply source, and fuel is normally supplied to the fuel passage at a constant high pressure. Therefore, it is configured so that when the needle valve 35 opens the injection hole 33, the fuel being supplied at a constant high pressure to the fuel passage 37 is jetted at a constant high pressure into a fuel room of an internal combustion engine (not shown).

The upper end of the needle valve 35 has a large internal diameter, and accommodates a cylinder 39 and a slidable piston 41 which are formed in the container 31. The container 31 also accommodates a piezoelectric actuator 43 provided with the abovementioned multilayer piezoelectric element.

In the above injector, when the piezoelectric actuator 43 spreads upon application of a voltage, the piston 41 is pressed, and the needle valve 35 closes the injection hole 33, thereby stopping the fuel supply. It is also configured so that when the voltage application is stopped, the piezoelectric actuator 43 contracts, and a disc spring 45 pushes back the piston 41, and the injection hole 33 is communicated with the fuel passage 37, thereby performing fuel jetting.

While the present invention is concerned with the multilayer piezoelectric elements and the injector, the present invention is not limited to the above preferred embodiments. For example, the present invention is applicable to drive elements mounted on fuel injectors of automobile engines, liquid injectors such as ink jets, precision positioners and shock prevention devices in optical devices and the like, or alternatively, to sensor elements mounted on combustion pressure sensors, knock sensors, acceleration sensors, load sensors, ultrasonic sensors, pressure sensitive sensors, yaw rate sensors and the like, as well as circuit elements mounted on piezoelectric gyroscopes, piezoelectric switches, piezoelectric transformers, piezoelectric breakers and the like. Besides these, it is possible to practice as long as being elements using piezoelectric characteristics.

Hereinafter, the present invention will be described in further detail by illustrating examples, without limiting the present invention to the following examples.

EXAMPLES

Example 1

A piezoelectric actuator composed of the multilayer piezoelectric element of the present invention was manufactured as follows.

Firstly, slurry was prepared by mixing calcined powder of piezoelectric ceramic composed mainly of lead zirconate titanate ($PbZrO_3$—$PbTiO_3$) having a mean particle size of 0.4 µm, binder and plasticizer. Then, a plurality of ceramic green sheets constituting piezoelectric body 11 having a thickness of 150 µm were prepared by doctor blade method.

Conductive paste obtained by adding binder to silver-palladium alloy (95% by mass of silver and 5% by mass of palladium) was printed on one surface of each of the ceramic green sheets by screen printing method. At this time, conductive paste obtained by adding binder to silver-palladium alloy (95% by mass of silver and 5% by mass of palladium) was printed onto portions where the different metal layers 12B should be formed so as to have a thickness of 5 µm or 10 µm after sintering. Depending on the case, voids were formed in the metal layers by adding acryl beads having a mean particle size of 0.2 µm to the above conductive paste. Conductive paste, which was obtained by adding a proper amount of acryl beads having a mean particle size of 0.2 µm and further adding binder to the particles of silver-palladium alloy (95% by mass of silver and 5% by mass of palladium), whose surfaces were oxidized, was printed onto regions for forming the high resistance metal layers 12A so as to have a thickness of 1 µm to 6 µm after sintering.

There were prepared 300 sheets on which the conductive pastes were thus printed. Separately, green sheets constituting protection layers were prepared. These two kinds of sheets were stacked so that 30 pieces of the protection layers, 300 pieces of stacked bodies and 30 pieces of the protection layers were arranged in this order and from bottom to top. This was then pressed, debindered and sintered. In the sintering process, after retaining at 800° C. for two hours, the sintering was performed at 1000° C. for two hours. Table 1 shows the void ratio of the obtained high resistance metal layers 12A.

The high resistance metal layers 12A in the stacked body 13 had the layer number as shown in Table 1. The high resistance metal layers 12A, except for that of Sample No. 9, were regularly arranged. Specifically, in Sample No. 1 that was one in the layer number of the high resistance metal layers, the high resistance metal layer was arranged on the 150th layer from the top of the stacked body. In Sample No. 2 that was two in the layer number of the high resistance metal layers, the high resistance metal layers were regularly arranged on the 100th layer and 200th layer from the top of the stacked body. In Sample No. 3 that was five in the layer number of the high resistance metal layers, the high resistance metal layers were regularly arranged at intervals of 50 layers from the top of the stacked body. In the sample that was 14 in the layer number of the high resistance metal layers, the high resistance metal layers were regularly arranged at intervals of 20 layers, and the sample that was 59 in the layer number of the high resistance metal layers, the high resistance metal layers were regularly arranged at intervals of 5 layers. In the sample that was 10 in the layer number of the high resistance metal layers, the high resistance metal layers were regularly arranged at intervals of 26, 27, 27, 28, 28, 28, 28, 28, 27 and 27. In the sample that was 39 in the layer number of the high resistance metal layers, the high resistance metal layers were regularly arranged by alternately taking the intervals of seven layers and eight layers from the top of the stacked body, such as 7, 8, 7 and 8. In the sample that was 20 in the layer number of the high resistance metal layers, the high resistance metal layers were regularly arranged at the intervals of 13, 13, 13, 13, 14, 14, 15, 15, 16, 16, 16, 16, 16, 15, 15, 14, 14, 13, 13 and 13. In Sample No. 9, which was the sample that was 20 in the layer number of the high resistance metal layers, and the high resistance metal layers were not regularly arranged, the high resistance metal layers were arranged from the top of the stacked body at the intervals of 5, 5, 25, 25, 15, 10, 20, 20, 10, 10, 10, 10, 10, 20, 20, 10, 15, 25, 25 and 5.

As the high resistance metal layers 12A, depending on the case, there were prepared those containing a high resistance component such as PZT, lead titanate, alumina, titania, silicon nitride, silica or the like.

Next, to a mixture of flake-shaped silver powder having a mean particle size of 2 µm and amorphous glass powder composed mainly of silicon having a mean particle size of 2 µm and a softening point of 640° C., 8 parts by mass of binder was added with respect to 100 parts by mass of the mixture of the silver powder and the glass powder, and sufficiently mixed together to obtain silver glass conductive paste. Subsequently, the silver glass conductive paste thus obtained was printed on a mold releasing film by screen printing. This was dried and then separated from the mold releasing film, thereby obtaining silver glass conductive paste sheet. The mean particle size of the flake-shaped powder was measured as follows. That is, a photograph of this powder was taken by using a scanning electron microscope (SEM). A line was drawn on the photograph, and 50 pieces of lengths over which particles and the line were crossed were measured and averaged. The result was employed as a mean particle size.

The silver glass paste sheet was then transferred to and stacked on the surface of the stacked body 13 on which external electrodes 15 should be formed. This was then baked at 700° C. for 30 minutes, thereby forming a pair of external electrodes 15.

Then, the polarization processing was performed by connecting lead wires to the external electrodes 15, respectively, and by applying a dc electric field of 3 kV/mm for 15 minutes through the lead wires to the positive electrode and the negative electrode of the external electrodes 15, respectively, resulting in the piezoelectric actuator using the multilayer piezoelectric element as shown in FIG. 1. By applying a dc voltage of 170V to the obtained multilayer piezoelectric element, every piezoelectric actuator had a displacement in the stacking direction.

The following test was conducted in which each piezoelectric actuator was continuously driven up to $2\times10^9$ times by applying an alternating voltage of 0 to +170V at a frequency of 300 Hz at room temperature. The test was conducted using 100 pieces per sample. After the test, the rate of the fractured samples was calculated, and the results were presented in Table 1, as a fracture rate after testing. Further, using a metal microscope and an SEM or the like, the stacked portions were observed to count the number of layers with peeling. Further, the absolute value of a difference between the displacement of the multilayer piezoelectric element at the initial stage and the displacement of the multilayer piezoelectric element after the test is divided by the displacement of the multilayer piezoelectric element at the initial stage, and the result was multiplied by 100. The obtained value was presented in Table 1, as a rate of change in the displacements before and after the driving test. The results are shown in Table 1.

TABLE 1

|   | Number of high resistance metal layers | Arrangement of high resistance metal layers | Void ratio of high resistance metal layers % | Void ratio of other metal layers % | High resistance component content in high resistance metal layers % | High resistance component content in other metal layers % |
|---|---|---|---|---|---|---|
| * I-1 | 1 | — | 70 | 1 | 1 | 1 |
| I-2 | 2 | Almost regular | 70 | 1 | 1 | 1 |
| I-3 | 5 | Almost regular | 70 | 1 | 1 | 1 |
| I-4 | 10 | Almost regular | 70 | 1 | 1 | 1 |
| I-5 | 14 | Almost regular | 70 | 1 | 1 | 1 |
| I-6 | 20 | Almost regular | 70 | 1 | 1 | 1 |
| I-7 | 39 | Almost regular | 70 | 1 | 1 | 1 |
| I-8 | 59 | Almost regular | 70 | 1 | 1 | 1 |
| I-9 | 20 | Irregular | 70 | 1 | 1 | 1 |
| I-10 | 20 | Almost regular | 30 | 1 | 1 | 1 |
| I-11 | 20 | Almost regular | 40 | 1 | 1 | 1 |
| I-12 | 20 | Almost regular | 50 | 1 | 1 | 1 |
| I-13 | 20 | Almost regular | 90 | 1 | 1 | 1 |
| I-14 | 20 | Almost regular | 99 | 1 | 1 | 1 |
| I-15 | 20 | Almost regular | 70 | 5 | 1 | 1 |
| I-16 | 20 | Almost regular | 70 | 10 | 1 | 1 |
| I-17 | 20 | Almost regular | 1 | 1 | 40 | 1 |
| I-18 | 20 | Almost regular | 1 | 1 | 50 | 1 |
| I-19 | 20 | Almost regular | 1 | 1 | 70 | 1 |
| I-20 | 20 | Almost regular | 1 | 1 | 90 | 1 |
| I-21 | 20 | Almost regular | 1 | 1 | 99 | 1 |
| I-22 | 20 | Almost regular | 1 | 1 | 70 | 1 |
| I-23 | 20 | Almost regular | 1 | 1 | 70 | 1 |
| I-24 | 20 | Almost regular | 1 | 1 | 70 | 1 |
| I-25 | 20 | Almost regular | 1 | 1 | 70 | 1 |
| I-26 | 20 | Almost regular | 1 | 1 | 70 | 1 |
| I-27 | 20 | Almost regular | 70 | 1 | 1 | 1 |
| I-28 | 20 | Almost regular | 70 | 1 | 1 | 1 |
| I-29 | 20 | Almost regular | 70 | 1 | 1 | 1 |
| I-30 | 20 | Almost regular | 70 | 1 | 1 | 1 |
| I-31 | 20 | Almost regular | 70 | 1 | 1 | 1 |
| I-32 | 20 | Almost regular | 70 | 1 | 1 | 1 |

|   | High resistance component | Thickness of high resistance metal layers μm | Thickness of other metal layers μm | Fracture rate after test % | Range of change in displacement before and after driving test % |
|---|---|---|---|---|---|
| * I-1 | PZT | 3 | 5 | 10 | 20 |
| I-2 | PZT | 3 | 5 | 3 | 10 |
| I-3 | PZT | 3 | 5 | 3 | 5 |
| I-4 | PZT | 3 | 5 | 0 | 3 |
| I-5 | PZT | 3 | 5 | 0 | 2.5 |
| I-6 | PZT | 3 | 5 | 0 | 1.5 |
| I-7 | PZT | 3 | 5 | 0 | 1.4 |
| I-8 | PZT | 3 | 5 | 0 | 1.3 |
| I-9 | PZT | 3 | 5 | 2 | 2.2 |
| I-10 | PZT | 3 | 5 | 0 | 2 |
| I-11 | PZT | 3 | 5 | 0 | 1.8 |
| I-12 | PZT | 3 | 5 | 0 | 1.6 |
| I-13 | PZT | 3 | 5 | 0 | 1.6 |
| I-14 | PZT | 3 | 5 | 0 | 1.8 |
| I-15 | PZT | 3 | 5 | 0 | 1.6 |
| I-16 | PZT | 3 | 5 | 0 | 1.6 |
| I-17 | PZT | 3 | 5 | 0 | 0.9 |
| I-18 | PZT | 3 | 5 | 0 | 0.5 |
| I-19 | PZT | 3 | 5 | 0 | 0.4 |
| I-20 | PZT | 3 | 5 | 0 | 0.5 |
| I-21 | PZT | 3 | 5 | 0 | 0.8 |

TABLE 1-continued

| | | | | | |
|---|---|---|---|---|---|
| I-22 | Lead titanate | 3 | 5 | 0 | 0.5 |
| I-23 | Alumina | 3 | 5 | 0 | 0.5 |
| I-24 | Titania | 3 | 5 | 0 | 0.6 |
| I-25 | Silicon nitride | 3 | 5 | 0 | 0.8 |
| I-26 | Silica | 3 | 5 | 0 | 0.8 |
| I-27 | PZT | 6 | 5 | 0 | 1.9 |
| I-28 | PZT | 4 | 5 | 0 | 1.6 |
| I-29 | PZT | 3 | 5 | 0 | 1.5 |
| I-30 | PZT | 2 | 5 | 0 | 1.4 |
| I-31 | PZT | 1 | 5 | 0 | 1.4 |
| I-32 | PZT | 3 | 10 | 0 | 1.4 |

The followings will be noted from Table 1. That is, Sample No. I-1 as a comparative example, in which the number of the high resistance metal layers in the multilayer piezoelectric element was one, could not disperse stress suitably and the generated crack was extended to the entire element, so that the fracture rate after the test was as large as 10%. The number of layers which caused peeling in the layers of the stacked body was as much as 100. Further, the range of change in the displacement before and after the driving test was as large as 10%, and the durability was low.

On the other hand, in Samples Nos. I-2 to I-32 as the preferred embodiments of the present invention, the fracture rate after the $2\times10^9$ times of continuous driving was not more than 3%, and these samples were extremely superior in durability to Sample No. I-1 as a comparative example.

In the samples where the high resistance metal layers were regularly arranged, for example, Sample No. I-6 was superior in durability because it had no fracture after the test, and had a small rate of change in the displacement before and after the test, to Sample No. I-9 where the high resistance metal layers were not regularly arranged.

In Samples Nos. I-10 to I-16, in which 20 layers of the high resistance metal layers were regularly arranged, and the void ratio of the high resistance metal layers was larger than that of other metal layers, the rate of change in the displacement before and after the driving test was as small as 2.0% or below, showing that these samples had excellent durability as the multilayer piezoelectric element. In Samples Nos. I-11 to I-16, in which the void ratio of the high resistance metal layers was 40 to 99%, the rate of change in the displacement before and after the driving test was smaller, namely 1.8% or below, showing that these samples had excellent durability.

In Samples Nos. I-17 to I-16, in which 20 layers of the high resistance metal layers were regularly arranged, and the high resistance component content in the high resistance metal layers was higher than that of other metal layers, any one of these samples was not fractured, and the rate of change in the displacement before and after the driving test was remarkably small, namely 0.4% to 0.9%, showing that these samples had excellent durability as the multilayer piezoelectric element. The samples using PZT, lead titanate, alumina or titania had further excellent durability.

In Samples Nos. I-6 and I-28 to I-32, in which the high resistance metal layers and other metal layers had different thicknesses in order to confirm the effect produced by setting so that the high resistance metal layer had a smaller thickness than other metal layers, the rate of change in the displacement before and after the driving test was as small as 1.6% or below, showing superior durability to Sample No. I-27, in which the high resistance metal layer had a larger thickness than other metal layers.

Further, in the sample in which the electrical resistance of the high resistance metal layers is 1/10 to 1000 times greater than that of the piezoelectric layers, and in the sample in which the electrical resistance of the high resistance metal layers is at least 1000 times greater than that of other metal layers, no peeling occurred in the high resistance metal layers, exhibiting excellent durability.

Thus, it was confirmed that the injectors accommodating the multilayer piezoelectric element of the present invention performed efficient injection and exhibited excellent durability, thereby contributing to environmental friendly products.

Example 2

A piezoelectric actuator composed of the multilayer piezoelectric element of the present invention was manufactured as follows. Firstly, slurry was prepared by mixing calcined powder of piezoelectric ceramic composed mainly of lead zirconate titanate ($PbZrO_3$—$PbTiO_3$) having a mean particle size of 0.4 μm, binder and plasticizer, and a plurality of ceramic green sheets constituting piezoelectric body 21 having a thickness of 150 μm were prepared by doctor blade method.

Then, 300 ceramic green sheets were stacked one upon another and sintered, each having one surface on which conductive paste obtained by adding binder to silver-palladium alloy (95% by mass of silver and 5% by mass of palladium) was provided by screen printing method. In the sintering process, after retaining at 800° C., the sintering was performed at 1000° C.

At this time, printing onto the regions for forming metal layers 22a was performed so as to have a thickness of 10 μm by a process using a resist thickness of 20 μm. Printing onto the region for forming partial metal layers 22c was performed so as to have a thickness of 5 μm by a process using a resist thickness of 10 μm. The partial metal layers were arranged as shown in Table 2. In the metal layers 22b composed of the partial metal layers 22c, six pieces of the partial metal layers 22c were arranged as shown in FIG. 3(b). Sample No. II-5 was configured so that the single partial metal layer 22c was further divided into 25 (5 pieces×5 pieces) partial metal layers. That is, in Sample No. II-5, 150 partial metal layers were arranged per layer.

Next, to a mixture of flake-shaped silver powder having a mean particle size of 2 μm, and amorphous glass powder composed mainly of silicon having a mean particle size of 2 μm and a softening point of 640° C., 8 parts by mass of binder was added with respect to 100 parts by mass of the mixture of the silver powder and the glass powder, and sufficiently mixed together to obtain silver glass conductive paste. Subsequently, the silver glass conductive paste was printed on a mold releasing film by screen printing. This was dried and then separated from the mold releasing film, thereby obtaining a silver glass conductive paste sheet.

The silver glass paste sheet was then transferred to and stacked on the surface of the stacked body 23 on which external electrodes should be formed. This was then baked at 700° C. for 30 minutes, thereby forming external electrodes 25.

Then, the polarization processing was performed by connecting lead wires to the external electrodes 25, respectively, and applying a dc electric field of 3 kV/mm for 15 minutes through the lead wires to the positive electrode and the negative electrode of the external electrodes 25, respectively, resulting in the piezoelectric actuator using the multilayer piezoelectric element as shown in FIG. 3.

By applying a dc voltage of 170V to the obtained multilayer piezoelectric element, every piezoelectric actuator had a displacement in the stacking direction.

The following test was conducted in which each piezoelectric actuator was continuously driven up to $1 \times 10^9$ times by applying an alternating voltage of 0 to +170V at a frequency of 150 Hz at room temperature. The test results are shown in Table 2.

It should be understood that the multilayer piezoelectric elements and the injectors of the present invention are not limited to the foregoing embodiments but are susceptible of various changes and modifications within the scope of the claims of the present invention. For example, although the foregoing embodiments have described the cases where the external electrodes 15 or the external electrodes 25 are formed on the opposed side surfaces of the stacked body 13 or 23, respectively, each pair of the external electrodes 15 or the external electrodes 25 may be formed on the adjacent side surfaces, respectively.

The invention claimed is:

1. A multilayer piezoelectric element comprising:
a plurality of piezoelectric layers and a plurality of metal layers which are alternately stacked one upon another, wherein the metal layers include a plurality of high resistance metal layers having a higher electrical resistance than adjacent different metal layers on both sides, and

TABLE 2

| No | Arrangement location of partial metal layers in 300 pieces of metal layers | Configuration of partial metal layers | Number of partial metal per layer | Metal comprising metal layers composed of a plurality of partial metal layers | Displacement in initial state (μm) | Displacement after continuous driving of $1 \times 10^9$ times (μm) | Peeling on stacked portions after continuous driving of $1 \times 10^9$ times (μm) | Noise generation of harmonic components | Hum sound generation at more than 1 kHz |
|---|---|---|---|---|---|---|---|---|---|
| II-1 | 150th layer | Composite arrangement with FIG. 4(a) and FIG. 4(b) | 6 | Ag, Pd | 50.0 | 49.9 | None | None | None |
| II-2 | 150th layer 151st layer | FIG. 4(a) | 6 | Ag, Pd | 50.0 | 49.9 | None | None | None |
| II-3 | 1st layer 300th layer | Composite arrangement with FIG. 4(a) and FIG. 4(b) | 6 | Ag, Pd | 55.0 | 54.9 | None | None | None |
| II-4 | 50th layer 100th layer 150th layer 200th layer 250th layer | Composite arrangement with FIG. 4(a) and FIG. 4(b) | 6 | Ag, Pd | 60.0 | 59.9 | None | None | None |
| II-5 | 50th layer 100th layer 150th layer 200th layer 250th layer | Composite arrangement with FIG. 4(a) and FIG. 4(b) | 150 | Ag, Pd | 60.0 | 60.0 | None | None | None |
| *II-6 | None | — | — | — | 45.0 | 42.0 | Occurred | Occurred | Occurred |

It will be noted from Table 2 that in Sample No. II-6 as a comparative example, the stress exerted on multilayer interfaces was concentrated at a point and load was increased, causing delamination, as well as hum and noise.

On the contrary, in Sample Nos. II-1 to II-5 as the preferred embodiments of the present invention, even after the continuous driving of $1 \times 10^9$ times, these had no remarkable drop of the element displacement and retained the necessary effective displacement as a piezoelectric actuator, thus enabling the manufacture of the piezoelectric actuators having excellent durability, while remaining free from malfunction.

Especially, it can be seen that Sample No. 11-3, in which a stress relaxing layer and a stress concentrating layer were adjacent to each other with a piezoelectric body in between, can manufacture the multilayer actuator enabling the element displacement to be increased and stabilized. Further, Samples Nos. II-4 and 5, in which stress relaxing layers were interposed with a piezoelectric body in between, achieved the largest element displacement and had little change in the element displacement and extremely excellent durability. This enables the manufacture of the multilayer actuator with stable element displacement.

wherein only one metal layer which is either the high resistance metal layer or the different metal layer exists between the piezoelectric layers adjacent to each other.

2. The multilayer piezoelectric element according to claim 1, wherein the high resistance metal layers are arranged so as to interpose a plurality of different metal layers.

3. The multilayer piezoelectric element according to claim 2, wherein the high resistance metal layers have an internal void ratio higher than a void ratio of the different metal layers.

4. The multilayer piezoelectric element according to claim 2, wherein the high resistance metal layers contain a high resistance component having a higher electrical resistance than the different metal layers, and have a larger high resistance component content than the different metal layers.

5. The multilayer piezoelectric element according to claim 2, wherein the high resistance metal layers have a smaller thickness than the different metal layers.

6. The multilayer piezoelectric element according to claim 2, wherein the electrical resistance of the high resistance metal layers is at least 1000 times greater than that of the different metal layers.

7. The multilayer piezoelectric element according to claim 1, wherein the high resistance metal layers are arranged regularly.

8. The multilayer piezoelectric element according to claim 1, wherein the electrical resistance of the high resistance metal layers is 1/10 to 1000 times greater than that of the piezoelectric layers.

9. The multilayer piezoelectric element according to claim 1, wherein a pair of external electrodes with the metal layers connected thereto are formed on side surfaces of a stacked body, respectively.

10. An injector comprising a container having an injection hole and a multilayer piezoelectric element according to claim 1, wherein a liquid filled in the container is discharged from the injection hole by the driving of the multilayer piezoelectric element.

11. A multilayer piezoelectric element comprising:
a plurality of piezoelectric layers and a plurality of metal layers which are alternately stacked one upon another,
wherein at least one layer of the metal layers comprises a plurality of partial metal layers interposed between the piezoelectric layers, and
the plurality of partial metal layers have the same composition,
the partial metal layers having one of a gradual decrease and a gradual increase in width with decreasing distance to the piezoelectric layers adjacent to the metal layers composed of the partial metal layers.

12. The multilayer piezoelectric element according to claim 11, wherein portions of the partial metal layers are connected at both ends in thickness directions of the partial metal layers to adjacent oppositely disposed piezoelectric layers, respectively, and the remaining portions of the partial metal layers are connected at only one end in the thickness direction of the partial metal layers to the piezoelectric layers, respectively.

13. The multilayer piezoelectric element according to claim 11, further comprising a plurality of metal layers composed of the partial metal layers.

14. The multilayer piezoelectric element according to claim 13, wherein the metal layers composed of the partial metal layers are arranged so as to interpose the piezoelectric layers, respectively.

15. The multilayer piezoelectric element according to claim 13, wherein the metal layers composed of the partial metal layers are arranged regularly.

16. The multilayer piezoelectric element according to claim 11, wherein the partial metal layers are composed of one selected from the group consisting of silver, palladium and an alloy of these.

17. The multilayer piezoelectric element according to claim 11, wherein there are voids between the partial metal layers adjacent to each other.

18. The multilayer piezoelectric element according to claim 11, wherein a plurality of different metal layers other than the metal layers are interposed between the metal layers composed of the plurality of partial metal layers.

* * * * *